United States Patent
Saito

(10) Patent No.: US 9,667,242 B2
(45) Date of Patent: May 30, 2017

(54) SEMICONDUCTOR DEVICE WITH SERIALLY AND SPIRALLY CONNECTED DIODES

(71) Applicant: Fuji Electric Co., Ltd., Kanagawa (JP)

(72) Inventor: Masaru Saito, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/844,986

(22) Filed: Sep. 3, 2015

(65) Prior Publication Data

US 2016/0104724 A1    Apr. 14, 2016

(30) Foreign Application Priority Data

Oct. 14, 2014 (JP) ................................. 2014-209783

(51) Int. Cl.
*H03K 17/687*    (2006.01)

(52) U.S. Cl.
CPC .................................. *H03K 17/687* (2013.01)

(58) Field of Classification Search
CPC ............ H01L 27/1207; H01L 27/0251; H01L 27/0705; H01L 24/06; H01L 29/401; H01L 24/49; H03K 17/687; H03K 17/08; H03K 17/0822; H03K 17/102; H03K 17/79

USPC ........ 327/108, 109, 110, 111, 112; 363/21.1, 363/21.15, 21.16

See application file for complete search history.

(56) References Cited

U.S. PATENT DOCUMENTS

2008/0117653 A1    5/2008  Saito
2009/0231021 A1*   9/2009  Koyama ............. H01L 27/0251
                                                        327/535

FOREIGN PATENT DOCUMENTS

JP    2008-153636 A    7/2008

* cited by examiner

*Primary Examiner* — John Poos
(74) *Attorney, Agent, or Firm* — Chen Yoshimura LLP

(57) ABSTRACT

A semiconductor substrate of a first conductivity type having a first region of a second conductivity type formed in a surface thereof; an insulating film on the semiconductor substrate; a primary wiring line connected to the first region and configured to receive a voltage from outside; a plurality of diodes connected in series on the insulating film and having a spiral shape generally centering around the first region in a plan view, the diodes having one end of the series thereof connected to the primary wiring line and serving as a cathode; a resistor voltage divider having one end connected to another end of the series of diodes; a first connection wiring line connected to another end of the resistor voltage divider; and a second connection wiring line connected to a midpoint between the another end of the series of diodes and the another end of the resistor voltage divider.

9 Claims, 12 Drawing Sheets

SEMICONDUCTOR DEVICE WITH SERIALLY AND SPIRALLY CONNECTED DIODES

BACKGROUND OF THE INVENTION

Technical Field

The present invention relates to a semiconductor device, and in particular to a semiconductor device having a thin film resistive element formed on a field effect transistor through an insulating film.

Background Art

A switching power supply control IC, which is a semiconductor device, is specialized to control individual high breakdown voltage switching transistors. This IC, in an operational state, causes the high breakdown voltage switching transistors to operate to form their own power supply, but during start-up these transistors need to receive start-up current from the start-up circuit. The start-up circuit is ordinarily integrated on the same semiconductor substrate as the switching power supply control IC, which reduces the number of components and simplifies the power supply system.

The start-up current is the result of rectifying an input alternating current signal of AC 100 to 240V, and is supplied to the start-up circuit; thus, a normally-on device that is upstream from the start-up circuit requires a breakdown voltage of at least 450V. This normally-on device is formed monolithically with the switching power supply control IC, and therefore becomes a lateral junction field-effect transistor (JFET) having a high breakdown voltage. The current driving ability of this device determines the design specifications of the switching power supply device.

If the switching power supply device is unplugged from the outlet, and stops receiving voltage from the AC input, then the primary side input voltage will drop. If the switching power supply device continues to operate in this state, the ON time of the switching MOSFET will become long and produce heat. To prevent this problem, the switching power supply device has a brownout function that stops the switching operation of the power supply when the input voltage drops.

The methods to realize this brownout function can be generally categorized into external resistance dividing schemes and IC chip embedding schemes. In the IC chip embedding schemes, voltage dividing resistors having a high breakdown voltage are formed using the voltage-withstanding structure of a device (start-up device) with a high breakdown voltage.

When embedding inside the IC chip, the voltage-withstanding structure of the already-existing start-up device, which is the high breakdown voltage device, is used, and spiral-shaped resistors are added to a part of the structure. The resistors are arranged in a spiral shape such that the potential gradually decreases from the drain terminal disposed in the center of the start-up device, which has the highest potential, to along the periphery. The resistors are formed to the source and gate regions, which are arranged so as to surround the drain region. Therefore, by being integrated with the start-up device, it is possible to embed the resistors having the high breakdown voltage without providing a new voltage-withstanding structure (see Patent Document 1, for example).

When using a resistor voltage divider as the input voltage detection method, however, current consumption is always occurring in the resistor voltage divider while input voltage is being applied. This is an issue that occurs regardless of whether the resistor voltage divider is embedded in the semiconductor integrated circuit or not, and can ordinarily suppress power consumption by increasing the resistance of the entire resistor voltage divider.

When embedding this resistor voltage divider in an integrated circuit, however, the following two problems occur in increasing the resistance.

The first is that the area of the start-up terminal is enlarged in order to secure the length of the resistive element. The second is that, in order to increase the per unit length resistance, the impurity dosage is diluted, which greatly increases variations in the resistance. One method to solve the second problem is to add an adjustable circuit such as a trimmer, but this complicates the circuit configuration.

RELATED ART DOCUMENT

Patent Document

Patent Document 1: Japanese Patent Application Laid-Open Publication No. 2008-153636

SUMMARY OF THE INVENTION

An aim of the present invention is to provide a semiconductor device that can have low power consumption. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate of a first conductivity type having a first region of a second conductivity type formed in a surface thereof; an insulating film on the semiconductor substrate; a primary wiring line connected to the first region and configured to receive a voltage from outside; a plurality of diodes connected in series on the insulating film, the series of diodes having a spiral shape generally centering around the first region in a plan view, the plurality of diodes having one end of the series thereof connected to the primary wiring line and serving as a cathode; a resistor voltage divider having one end connected to another end of the series of the diodes; a first connection wiring line connected to another end of the resistor voltage divider; and a second connection wiring line connected to a midpoint between the another end of the series of diodes and the another end of the resistor voltage divider.

In another aspect, the present disclosure provides a semiconductor device, including: a semiconductor substrate of a first conductivity type having a first region of a second conductivity type formed in a surface thereof; an insulating film provided on the semiconductor substrate; a primary wiring line connected to the first region and configured to receive a voltage from outside; a thin film semiconductor pattern on the insulating film, the thin film semiconductor pattern having a spiral shape generally centering around the first region in a plan view, one end of the thin film semiconductor pattern being connected to the primary wiring line; and a first connection wiring line connected to another end of the thin film semiconductor pattern; wherein the thin film semiconductor pattern includes: a plurality of diodes connected in series from the one end of the thin film semiconductor pattern, each diode having a region of the first conductivity type and a region of the second conductivity type continuously and alternately arranged along the spiral shape; and a resistor voltage divider formed from an end of the series of the plurality of diodes to the another end of the thin film semiconductor pattern, and wherein the semiconductor device further includes a second connection wiring line connected to a midpoint between the another end of the series of diodes and the another end of the thin film semiconductor pattern.

At least one aspect of the present invention makes it possible to lower the power consumption of the semiconductor device.

It is to be understood that both the foregoing general description and the following detailed description are exemplary and explanatory, and are intended to provide further explanation of the invention as claimed.

DETAILED DESCRIPTION OF EMBODIMENTS

Figure 1:
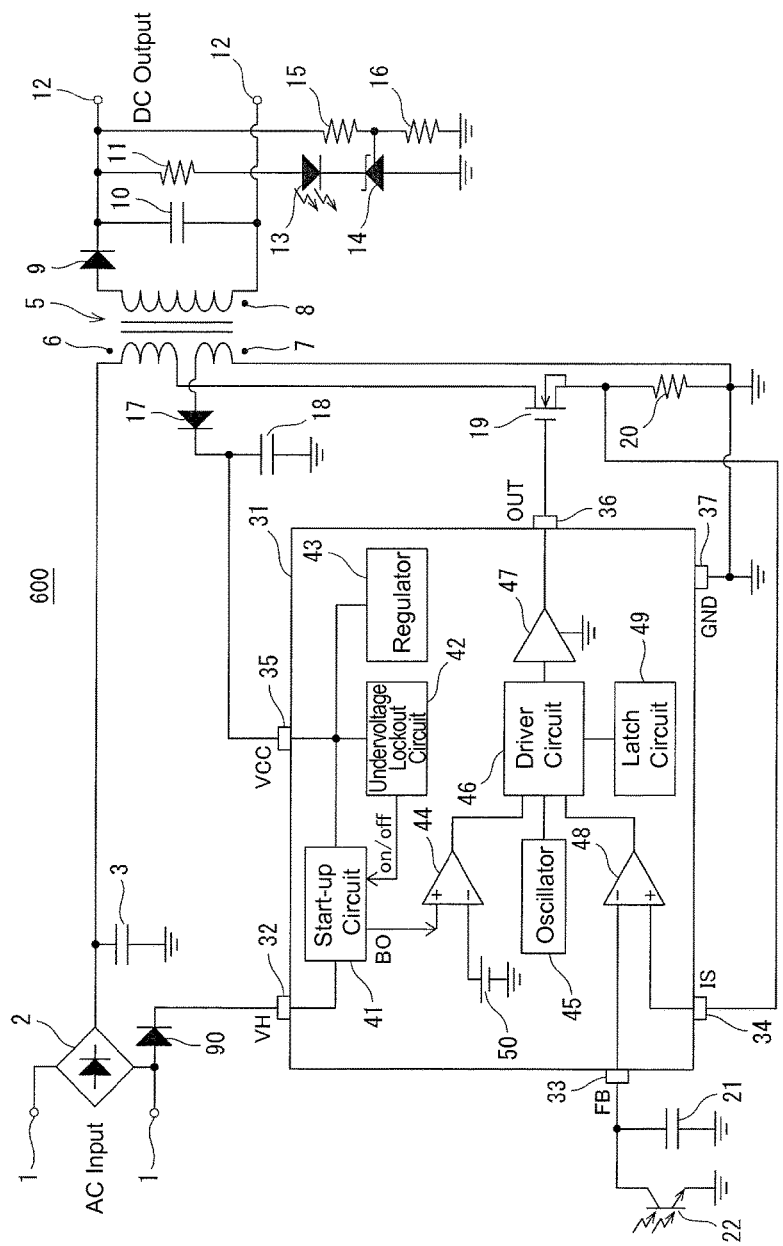
FIG. 1 is a circuit diagram showing a configuration of a switching power supply device of a semiconductor device according to Embodiment 1 of the present invention.

An embodiment of a semiconductor device of the present invention will be explained below with reference to figures.

In the present specification, "primary electrode region" means a semiconductor region having a low specific resistance as either a source region or drain region in a field effect transistor (FET). In an IGBT, this means a semiconductor region as either an emitter region or a collector region, and is thus a term that depends on the semiconductor device. More specifically, if the above-mentioned semiconductor region is defined as a first primary electrode region, then the other semiconductor region is the second primary electrode region. In other words, in a FET or SIT, "second primary electrode region" means a semiconductor region as either a source region or a drain region that is not the first primary electrode region, and in an IGBT, "second primary electrode region" means a semiconductor region as either an emitter region or a collector region that is not "the first primary electrode region." In Embodiments 1 to 3 below, a JFET and a MOSFET will be illustratively described as a high breakdown voltage active element, but the present invention is not limited to field effect transistors of a junction type, insulated gate type, or the like.

In the explanation of Embodiments 1 to 3 below, an example is described in which the first conductivity type is the p-type, and the second conductivity type is the n-type, but the opposite conductivity types can be selected, in which the first conductivity type is the n-type, and the second conductivity type is the p-type.

In the present specification and attached drawings, electrons or holes in layers or areas marked with an "n" or "p" signify majority carriers. A "+" or "−" attached to an "n" or "p" signifies that the impurity concentration is higher or lower, respectively, than a semiconductor region not having the "+" or "−."

In the explanation of Embodiments 1 to 3 below and the attached drawings, the same reference characters are attached to similar configurations and repetitive descriptions will be omitted. The respective attached drawings used to explain Embodiments 1 to 3 have been made to be easy to view and understand, and thus are not drawn to scale. The present invention is not limited to Embodiments 1 to 3 described below.

Embodiment 1

As shown in FIG. 1, a switching power supply device 600 includes a semiconductor device (control IC) 31 according to Embodiment 1 of the present invention. The semiconductor device 31 of Embodiment 1 has a VH terminal (high breakdown voltage input terminal) 32 that handles approximately 500V, for example, a feedback input terminal (hereinafter, "FB terminal") 33, a current sensor input terminal (hereinafter, "IS terminal") 34, a power supply voltage terminal of the control IC 31 (hereinafter, "VCC terminal") 35, a gate driver terminal of the MOSFET 19 (hereinafter, "OUT terminal") 36, and a ground terminal (hereinafter, "GND terminal") 37. The VH terminal 32 supplies current to the VCC terminal 35 when the power supply starts up. In Embodiment 1, voltage that is the result of an AC voltage being rectified and smoothed is applied to the VH terminal 32. The GND terminal 37 is grounded.

The AC input is supplied to a rectifier 2 via an AC input terminal pair (ports) 1. The rectifier 2 is connected to the AC input terminal pair 1 and performs full-wave rectification of the AC input. A power supply capacitor 3 is connected in parallel to the output terminal of the rectifier 2 and is charged with the direct current voltage output from the rectifier 2. The charged power supply capacitor 3 supplies direct current voltage to a primary coil 6 of a transformer 5. The power supply capacitor 3 is also connected to the VH terminal 32 of the control IC 31.

The primary coil 6 is connected between the power supply capacitor 3 and the drain terminal of the MOSFET 19, which functions as a switching device. The source terminal of the MOSFET 19 is connected to the IS terminal 34 of the semiconductor device 31 and one end of a resistor 20. The other end of the resistor 20 is grounded. This resistor 20 converts current flowing through the MOSFET 19 to voltage, and this voltage is applied to the IS terminal 34. The gate terminal of the MOSFET 19 is connected to the OUT terminal 36 of the control IC 31.

One end of an auxiliary coil 7 of the transformer 5 is connected in parallel to the anode terminal of a rectifier diode 17. The other end of the auxiliary coil 7 is grounded. Current that has been induced by the switching operation of the MOSFET 19 flows to the auxiliary coil 7. The rectifier diode 17 rectifies the current flowing through the auxiliary coil 7 and charges a smoothing capacitor 18 that is connected to the cathode terminal of the rectifier diode 17. The smoothing capacitor 18 is connected to the VCC terminal 35 of the control IC 31, and acts as a direct current power supply for causing the switching operation of the MOSFET 19 to continue.

The switching operation of the MOSFET 19 induces, at a secondary coil 8 of the transformer 5, a voltage that is based on the voltage of the power supply capacitor 3. One end of the secondary coil 8 is connected to the anode terminal of a rectifier diode 9. The cathode terminal of the rectifier diode 9 and the other end of the secondary coil 8 are connected to a DC output terminal pair (ports) 12. A smoothing capacitor 10 is also connected between the cathode terminal of the rectifier diode 9 and the other end of the secondary coil 8. The rectifier diode 9 rectifies the current flowing through the secondary coil 8, and charges the smoothing capacitor 10. The charged smoothing capacitor 10 supplies, to a load (not shown) connected to the DC output terminals 12, a direct current output (DC output) that has been controlled so as to reach a desired direct current voltage level.

A series resistor circuit formed by two resistors 15 and 16, and one end of a resistor 11 are connected to the anode terminal of the rectifier diode 9 and one connection node of the DC output terminal pair 12. The other end of the resistor 11 is connected to the anode terminal of a photodiode 13 that forms a photocoupler. The cathode terminal of the photodiode 13 is connected to the cathode terminal of a shunt regulator 14. The anode terminal of the shunt regulator 14 is grounded. These resistors 11, 15, 16, photodiode 13, and shunt regulator 14 form a voltage detection/feedback circuit that detects the direct current output voltage at both ends of the smoothing capacitor 10 and adjusts this direct current output voltage.

The photodiode 13 outputs an optical signal so that the direct current output voltage at both ends of the smoothing capacitor 10 becomes a prescribed level in accordance with the parameters at the shunt regulator 14. The optical signal is received by a phototransistor 22 that forms the photocoupler along with the photodiode 13, and this optical signal serves as a feedback signal for the control IC 31. The phototransistor 22 is connected to the FB terminal 33 of the semiconductor device 31, and this FB terminal 33 receives the feedback signal. The phototransistor 22 is also connected to a capacitor 21. This capacitor 21 acts as a noise filter against the feedback signal.

As shown in FIG. 1, the semiconductor device 31 of Embodiment 1 includes a start-up circuit 41, an undervoltage-lockout (UVLO) circuit 42, a regulator 43, a BO comparator 44, an oscillator 45, a driver circuit 46, an output amp 47, a pulse width modulator (PWM) 48, a latch circuit 49, and a reference power supply 50. The startup circuit 41 is connected to the VH terminal 32, VCC terminal 35, and non-inverting input terminal of the BO comparator 44. The start-up circuit 41 supplies current to the VCC terminal 35 when the power supply is starting up.

The undervoltage-lockout circuit 42 is connected to the VCC terminal 35 and the start-up circuit 41. The undervoltage-lockout circuit 42 causes the supply of current from the start-up circuit 41 to the VCC terminal 35 to stop when the current supplied from the start-up circuit 41 makes the voltage of the VCC terminal 35 reaches the necessary level for the semiconductor device 31 to operate. Further supply of current to the VCC terminal 35 is performed from the auxiliary coil 7. The regulator 43 is connected to the VCC terminal 35, and generates the necessary reference voltage for the operation of the respective units in the semiconductor device 31 in accordance with the voltage of the VCC terminal 35. After the power supply has started up, the semiconductor device 31 is driven by the reference voltage output from the regulator 43.

The inverting input terminal and the non-inverting input terminal of the PWM comparator 48 are respectively connected to the IS terminal 34 and the FB terminal 33. The PWM comparator 48 inverts the output in accordance with the magnitude relationship between the voltage of the inverting input terminal and the voltage of the non-inverting input terminal. The output of the PWM comparator 48 is received by the driver circuit 46.

The driver circuit 46 is connected to the oscillator 45, and receives oscillation signals from the oscillator 45. When the driver circuit 46 receives a turn-on signal from the oscillator 45 and the voltage of the non-inverting input terminal (i.e., voltage of the FB terminal 33) of the PWM comparator 48 is greater than the voltage of the inverting input terminal (i.e., voltage of the IS terminal 34), the output signal of the driver circuit 46 becomes high. The output amp 47 amplifies the high signal that is output from the driver circuit 46 and drives the gate of the MOSFET 19 via the OUT terminal 36.

Meanwhile, if the voltage of the inverting input terminal of the PWM comparator 48 becomes greater than the voltage of the non-inverting input terminal, the PWM comparator 48 inverts, and the output signal of the driver circuit 46 becomes low. The output amp 47 amplifies the low signal that is output from the driver circuit 46 and supplies this signal to the gate of the MOSFET 19 via the OUT terminal 36. Accordingly, the MOSFET 19 turns OFF, and current stops flowing to the MOSFET 19. In this manner, causing the threshold level of the PWM comparator 48 to change in accordance with the secondary side output voltage variably controls the ON period of the MOSFET 19, thereby stabilizing the secondary side output voltage.

The inverting input terminal of the BO comparator 44 is also connected to the reference power supply 50. The BO comparator 44 causes the output to be inverted in accordance with the magnitude relationship between the voltage of the non-inverting input terminal and the voltage of the inverting input terminal. As described later, the BO comparator 44 receives low voltage signals that have had the voltage thereof divided by resistors in the start-up circuit 44; therefore, the BO comparator 44 can be formed by a low breakdown voltage MOS. The output of the BO comparator 44 is received by the driver circuit 46.

If the voltage of the non-inverting input terminal of the BO comparator 44 is greater than the voltage of the inverting input terminal while the high signals are being output from the driver circuit 46, the output signal of the driver circuit 46 remains high. If the supply of voltage from the AC input stops, and the primary side input voltage drops, the voltage of the non-inverting input terminal of the BO comparator 44 will become less than the voltage of the inverting input terminal. In this case, the output signal of the driver circuit 46 inverts and becomes low; the switching operation of the MOSFET 19 stops; and the brownout function starts.

The latch circuit 49 is connected to the driver circuit 46. When an abnormality such as a rise in secondary side output voltage, heating of the control IC 31, and a drop in the secondary side output voltage is detected, the latch circuit 49 forcibly sets the output of the driver circuit 46 to low in order to protect against overvoltage, overheating, and overcurrent, and stops the supply of power to the secondary side output. This state is maintained until the VCC power supply voltage drops and the control IC 31 is reset. The elements forming the respective circuits and the like of the control IC 31 are formed on the same semiconductor substrate, for example, but the present invention is not limited to this.

Figure 2:
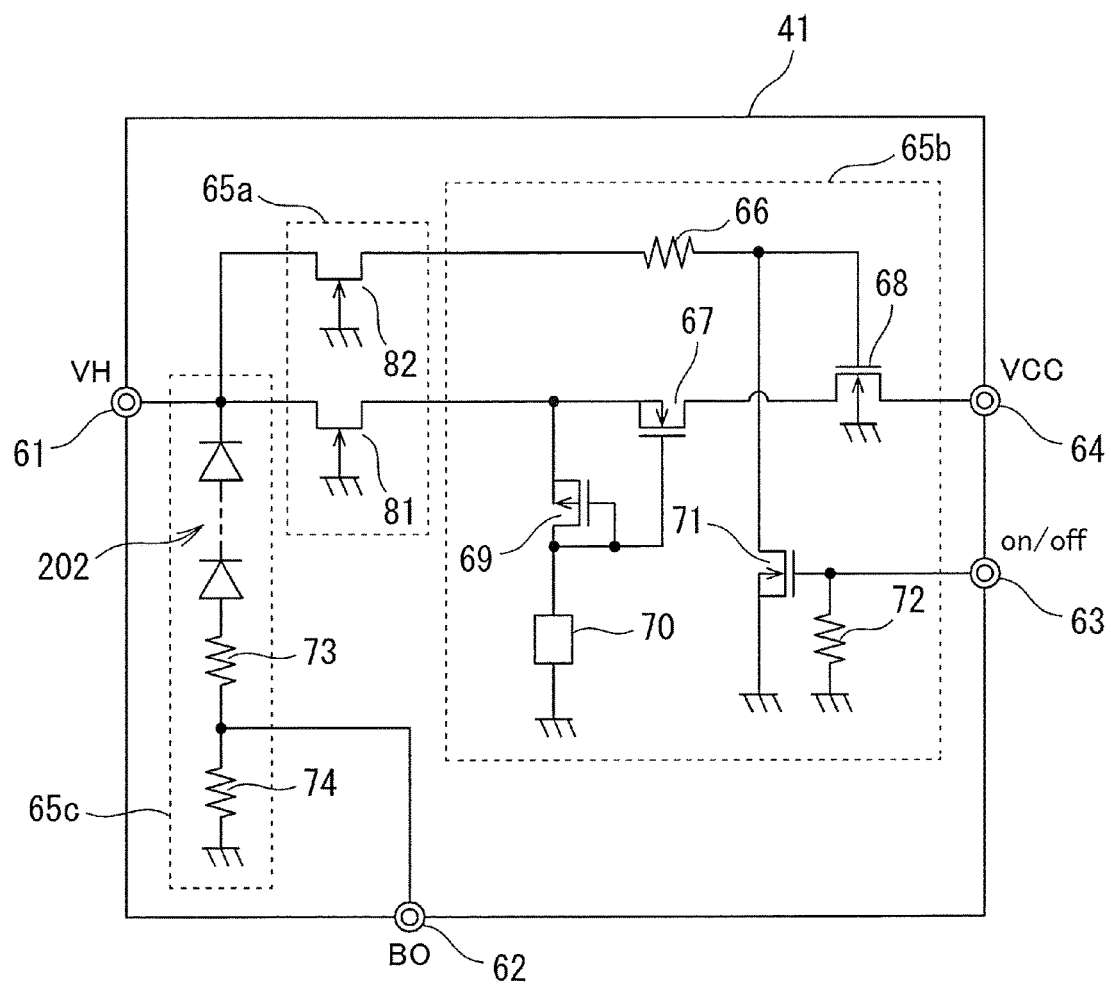
FIG. 2 is a circuit diagram of a configuration of a start-up circuit in the semiconductor device shown in FIG. 1.

Next, the start-up circuit 41 will be explained. As shown in FIG. 2, the start-up circuit 41 includes a VH terminal (high breakdown voltage input terminal) 61, a BO terminal (brownout input terminal) 62, an ON/OFF terminal (ON/OFF signal input terminal) 63, and a VCC terminal (power supply voltage terminal) 64. The VH terminal 61 and the VCC terminal 64 are respectively connected to the VH terminal 32 and the VCC terminal 35 of the control IC 31. The ON/OFF terminal 63 is connected to the undervoltage-lockout circuit 42.

The start-up circuit 41 also includes a start-up device 65a, a post start-up circuit 65b, and a resistor voltage divider 65c. The start-up device 65a includes two junction field effect transistors having a high breakdown voltage (high breakdown voltage JFETs 81 and 82) as active elements, for example. A series resistor circuit formed by resistors 73 and 74 is connected to the VH terminal 61 via a diode unit 202 (see FIG. 3) of a thin-film resistor 201. The post start-up circuit 65b includes a first PMOS transistor 67, a second PMOS transistor 69, a first NMOS transistor 68, a second NMOS transistor 71, a load 70, and a resistor 72. The resistor voltage divider 65c will be described in more detail later, but includes two resistors 73 and 74 that are connected in series to a resistor voltage divider section 203 (see FIG. 3) of the thin film resistive element (also referred to as "thin film semiconductor pattern) 201. The BO terminal 62 is connected to an intermediate node of the resistors 73 and 74, which are connected in series.

The BO terminal 62 is also connected to the non-inverting input terminal of the BO comparator 44. In other words, the input voltage to the VH terminal 61 that has had the voltage thereof divided by the resistors 73 and 74 is input to the non-inverting input terminal of the BO comparator 44. The resistance of the resistors 73 and 74 is at least 1MΩ, and has a maximum resistance defined by the ability to be provided in the semiconductor device, but the resistance of the resistors and the maximum resistance thereof are not limited to these. The maximum resistance may be approximately 10MΩ or below, for example.

The first JFET 81 and the second JFET 82 are normally-on junction field effect transistors, and have grounded gate terminals. The drain terminals of the first and second JFETs 81 and 82 share a common connection with the VH terminal 61. The source terminal of the first JFET 81 is connected to the source terminal of the first PMOS transistor 67 and the source terminal of the second PMOS transistor 69.

The gate terminal of the first PMOS transistor 67 is commonly connected to the gate terminal and the drain terminal of the second PMOS transistor 69. The drain terminal of the second PMOS transistor 69 is connected to the load 70. The first NMOS transistor 68 is connected between the drain terminal of the first PMOS transistor 69 and the VCC terminal 64.

The gate terminal of the first NMOS transistor 68 is connected to the source terminal of the second JFET 82 through a resistor 66. The gate terminal of the first NMOS transistor 68 is also connected to the drain terminal of the second NMOS transistor 71. The gate terminal of the second NMOS transistor 71 is connected to the ON/OFF terminal 63. The source terminal of the second NMOS transistor 71 is grounded. The gate terminal of the second NMOS transistor 71 is also grounded via a resistor 72.

In the start-up circuit 41 configured in this manner, the volt-ampere characteristics of the second PMOS transistor 69 and the impedance of the load 70 determine the current that flows through the second PMOS transistor 69. The second PMOS transistor 69 and the first PMOS transistor 67 are connected as a current mirror. The W/L value of the second PMOS transistor 69 is 1, whereas the W/L value of the first PMOS transistor 67 is 100. Accordingly, the first PMOS transistor 67 has a current that is 10 times that of the second PMOS transistor 69. It should be noted that W and L are channel width and channel length, respectively.

The first NMOS transistor 68 switches between ON and OFF in accordance with ON/OFF signals supplied from the undervoltage-lockout circuit 42 via the ON/OFF terminal 63. When the ON/OFF signal is low, the second NMOS transistor 71 is OFF, and a high voltage is input to the gate terminal of the first NMOS transistor 68; thus, the switch turns ON. This switch turning ON causes current to be supplied to the VCC terminal 35 of the control IC 31 from the start-up circuit 41 during start-up of the power supply described above.

Meanwhile, when the ON/OFF signal is high, the second NMOS transistor 71 turns ON, and the gate voltage of the first NMOS transistor 68 becomes zero; thus, the switch turns OFF. Accordingly, the current path between the VH terminal 61 and the VCC terminal 64 is blocked, and thus the supply of current from the start-up circuit 41 to the VCC terminal 35 stops.

It should be noted that the first JFET 81 and the second JFET 82 may be formed by a single JFET. When only formed by the first JFET 81, for example, the second JFET 82 is unnecessary, and the wiring that connects to the source of the second JFET 82 and the resistor 66 can be connected to the source of the first JFET 81.

Next, FIGS. 3 to 8 will be used to explain the first and second JFETs 81 and 82 and the thin film resistive element (thin film semiconductor pattern) 201 of the semiconductor device 31 according to Embodiment 1. Note that, in FIG. 3, the metal wiring, interlayer insulating film, field insulating film, and the like have been omitted in order to show clearly the features of the semiconductor device.

As shown in FIGS. 3 to 6, the first JFET 81 and the second JFET 82 are respectively formed in the surface of a semiconductor substrate 100 that is the first conductivity type (p-type).

The first and second JFETs 81 and 82 respectively have a first primary electrode region (drain region) 101 of the second conductivity type (n-type), a drift region 102 of the second conductivity type (n-type), a base region (gate region) 103 of the first conductivity type (p-type), a second primary electrode region (source region) 104 of the second conductivity type (n-type), and a gate electrode 250.

The first primary electrode region 101 is formed in the primary surface of the semiconductor substrate 100. The drift region 102 is formed in the primary surface of the semiconductor substrate 100 and surrounds the first primary electrode region 101 while contacting the first primary electrode region 101. The base region 103 is formed in the primary surface of the semiconductor substrate 100 and is selectively formed outside the drift region 102 so as to contact the drift region 102. The second primary electrode region 104 is formed in a plurality in the primary surface of the semiconductor substrate 100 outside the drift region 102 so as to contact the drift region 102 and to fit between the base region 103 and the drift region 102. The gate electrode 250 is formed on the primary surface of the semiconductor substrate 100 in an annular shape so as to surround the first primary electrode region 101. The first electrode region is formed from a field insulating film 109, which is selectively formed on the primary surface of the semiconductor substrate 100, to across the drift region 102 and the base region 103.

The drift region 102 is formed at a lower concentration than the first and second primary electrode regions 101 and 104, and forms a voltage-withstanding region of the JFETs 81 and 82, or namely, a voltage-withstanding structure.

The second primary electrode region (source region) 104 has four areas, for example, three of which are the second primary electrode region 104 of the JFET 81, and the remaining one of which is the second primary electrode region 104 of the JFET 82. The gate electrode 250 is formed of a polycrystalline silicon film that has been implanted with impurities that lower the resistance thereof, for example. The base region 104 is the area where the channel will be formed.

The thin film resistive element 201 is arranged on the voltage-withstanding region (drift region 102) and the first primary electrode region 101 of the first and second JFETs 81 and 82 via the field insulating film 109. The thin film resistive element 201 has one end connected to first primary electrode wiring 301, and is arranged in a spiral shape on the field insulating film 109 so as to surround the first primary electrode region 101. The field insulating film 109 is selectively formed by a selective oxidation method, and is a silicon dioxide film.

A first interlayer insulating film 210 made of a silicon dioxide film, for example, is provided on the primary surface of the semiconductor substrate 100 so as to cover the thin film resistive element 201 and the gate electrode 250. The first interlayer insulating film 210 has disposed thereon the first primary electrode wiring 301 formed in a first metal wiring layer, substrate potential-supplying wiring 302, base electrode wiring 303, second primary electrode wiring 304, and the like. First and second resistive connection wiring 305 and 306 are also provided.

Figure 5:
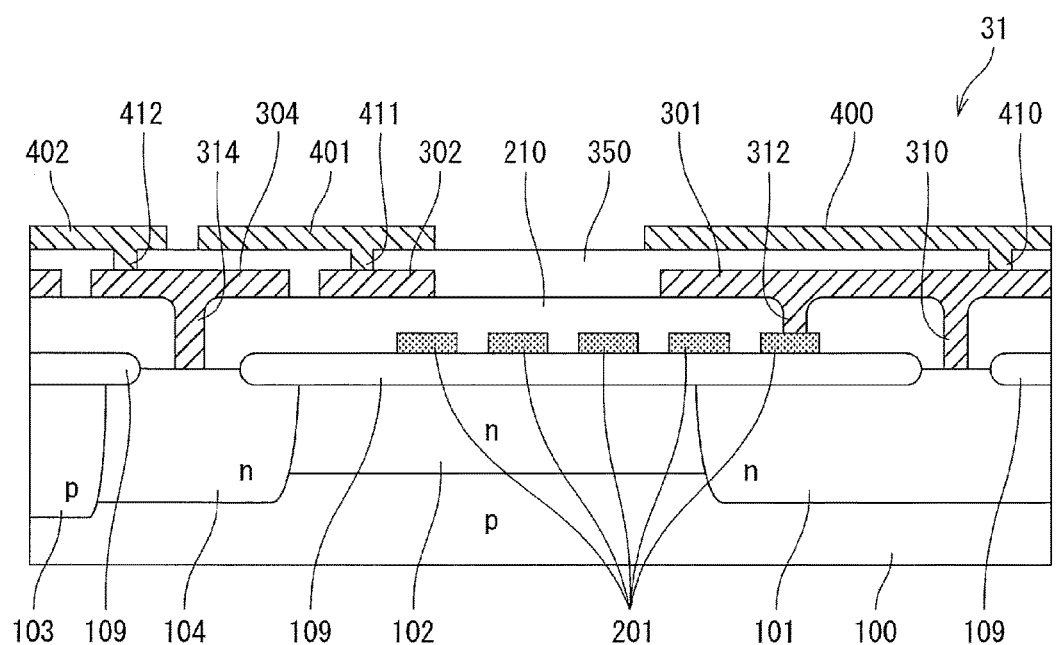
FIG. 5 is a cross-sectional view along the line IIa-IIa in FIG. 3.
Figure 6:
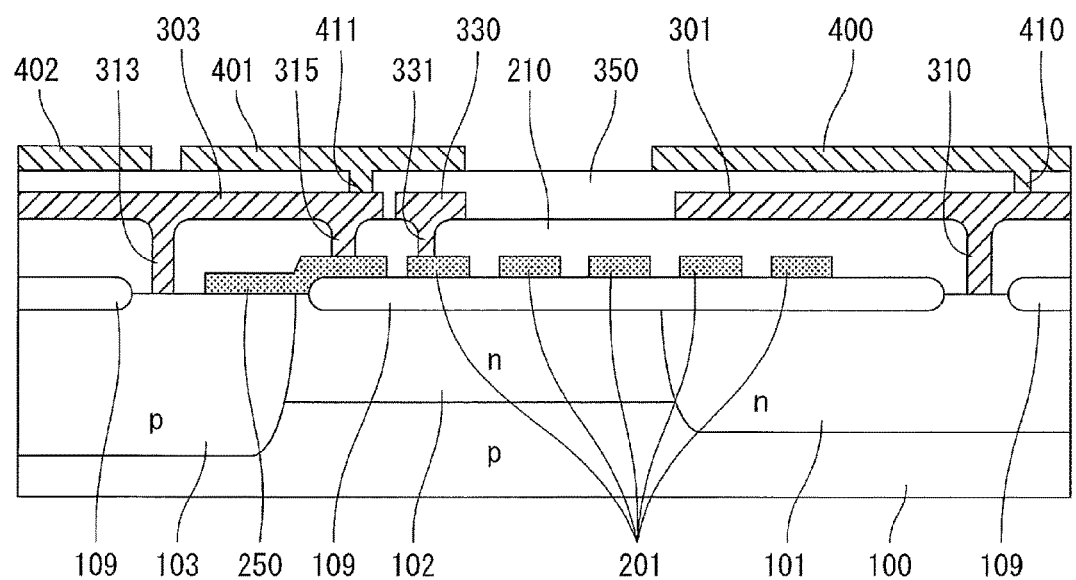
FIG. 6 is a cross-sectional view along the line IIb-IIb in FIG. 3.
Figure 7:
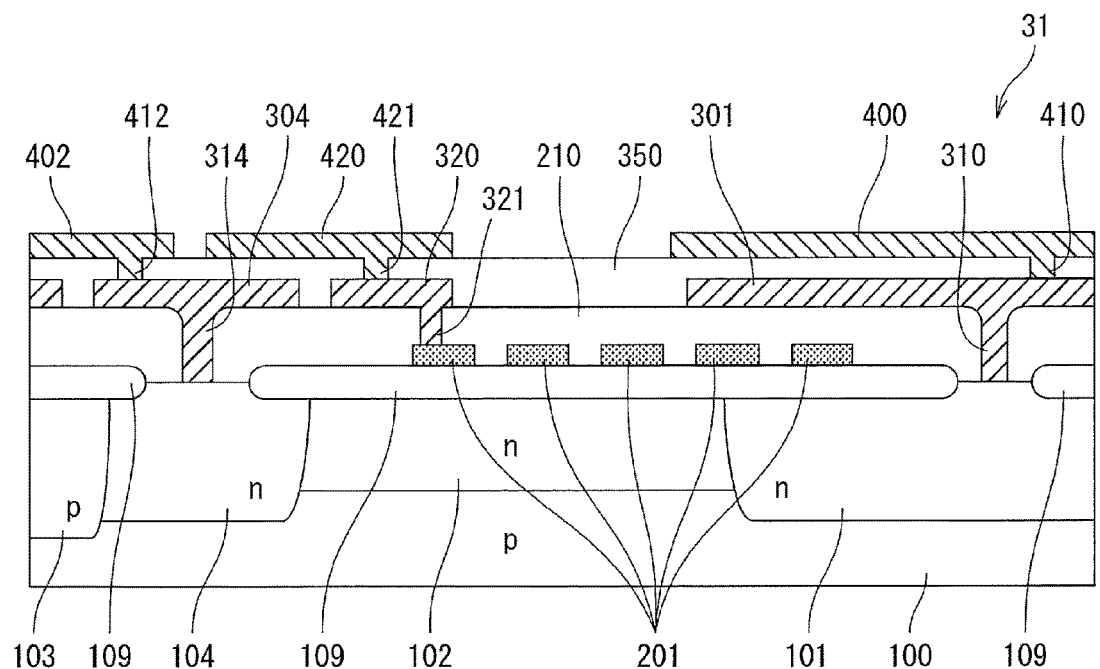
FIG. 7 is a cross-sectional view along the line IIc-IIc in FIG. 3.

As shown in FIGS. 5 to 7, a second interlayer insulating film 350 made of a silicon dioxide film, for example, is provided on the first interlayer insulating film 210 so as to cover the first primary electrode wiring 301, substrate potential-supplying wiring 302, base electrode wiring 303, second primary electrode wiring 304, first and second resistive connection wiring 305 and 306, and the like. The second interlayer insulating film 350 has wiring 400, wiring 401, wiring 402, wiring 420, and the like formed in a second metal wiring layer.

The first primary electrode wiring 301 is electrically and metallurgically connected to the first primary electrode region (drain region) 101 via a first primary electrode contact section 310, which penetrates the first interlayer insulating film 210. The first primary electrode wiring 301 is also electrically and metallurgically connected to one end (the inner termination) of the thin film resistive element 201 through a resistive contact section 312, which penetrates the first interlayer insulating film 210. The wiring 400 is electrically and mechanically connected to the first primary electrode wiring 301 via a contact section 410 that penetrates the second interlayer insulating film 350. The first primary electrode region 101 is common to the first JFET 81 and the second JFET 82, and the wiring 400 connects to the VH terminal 61 of the start-up circuit 41. In other words, voltage is externally applied to one end of the first primary electrode region 101, first primary electrode wiring 301, and thin film resistive element 201 via the VH terminal 61.

As shown in FIG. 6, the base electrode wiring 303 is electrically and metallurgically connected to the base region 103 and the gate electrode 250 via a base contact section 313 and a gate electrode contact section 315, which penetrate the first interlayer insulating film 210. The wiring 401 is electrically and metallurgically connected to the base electrode wiring 303 via a contact section 411 that penetrates the second interlayer insulating film 350. The wiring 401 is always grounded and has ground potential.

As shown in FIG. 5, the second primary electrode wiring 304 is electrically and metallurgically connected to three of the second primary electrode regions 104, for example, via a second primary electrode contact section 314, which penetrates the first interlayer insulating film 210. The wiring 402 is electrically and metallurgically connected to the second primary electrode wiring 304 via a contact section 412 that penetrates the second interlayer insulating film 350.

The three second primary electrode regions 104 to which the second primary electrode wiring 304 is connected serve as the second primary electrode region 104 of the first JFET 81. Although not shown, the rest of the second primary electrode wiring 304 is electrically and metallurgically connected to one of the second primary electrode regions via the second primary electrode contact section, which penetrates the first interlayer insulating film 210. The one second primary electrode region 104 to which the rest of the second primary electrode wiring 304 is connected serves as the second primary electrode region 104 of the second JFET 82.

Figure 3:
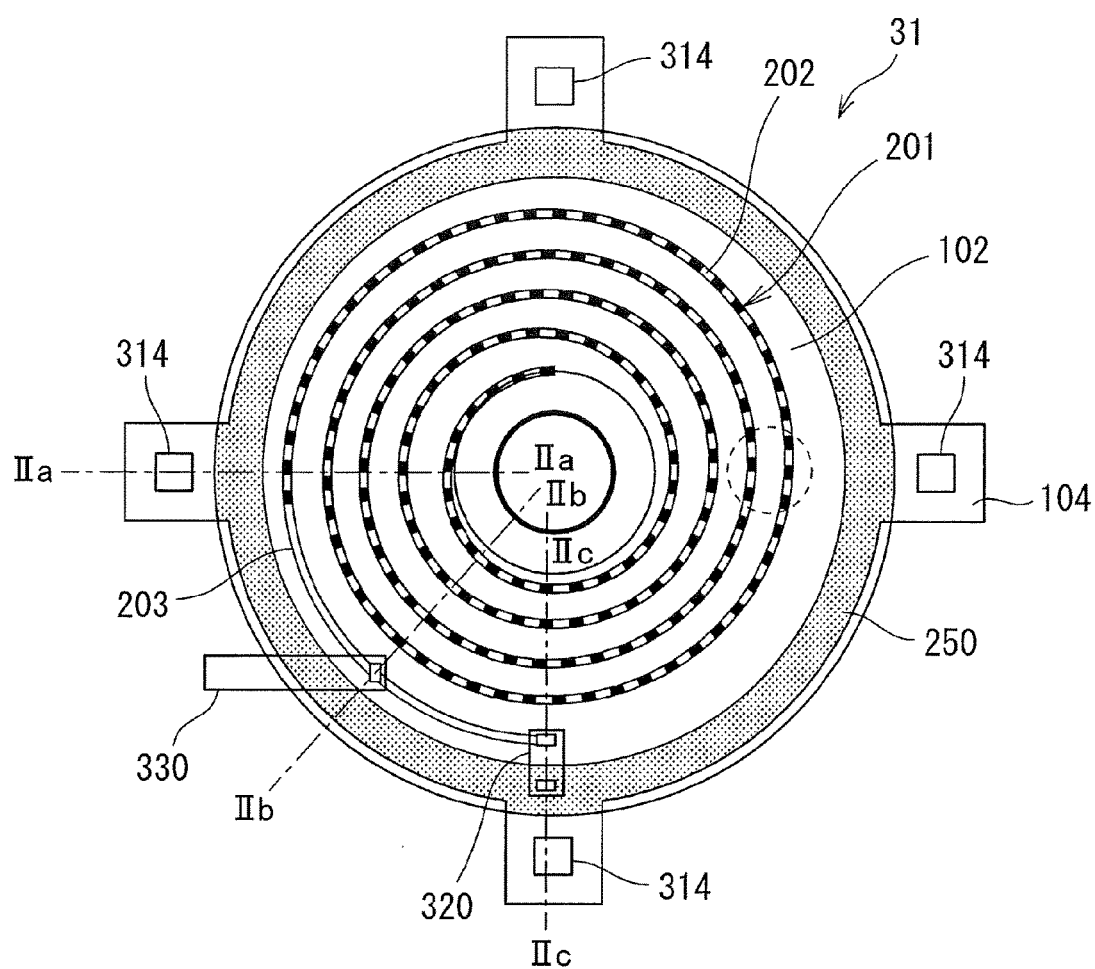
FIG. 3 is a schematic plan view of primary components of the semiconductor device according to Embodiment 1 of the present invention.
Figure 4:
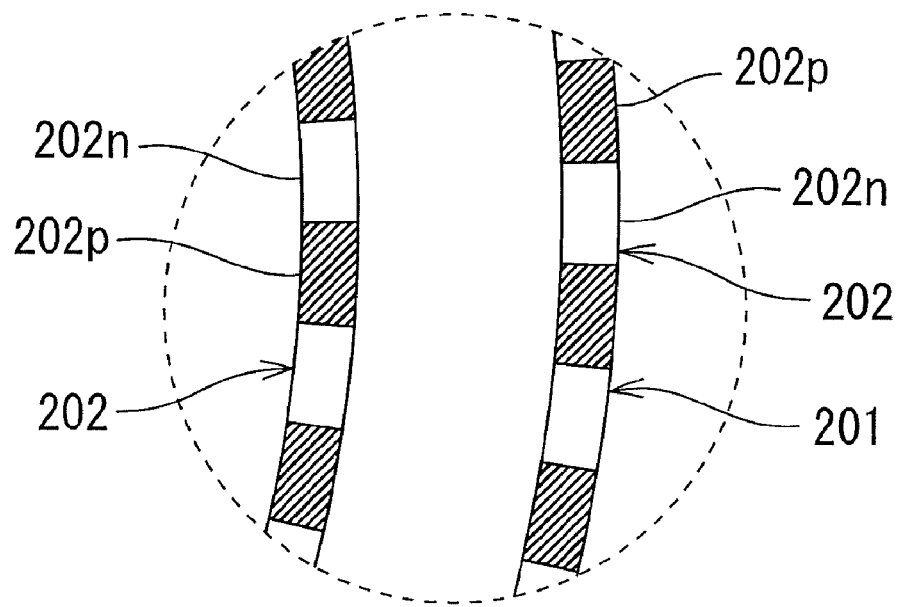
FIG. 4 is a plan view in which a portion of FIG. 3 has been enlarged.
Figure 8:
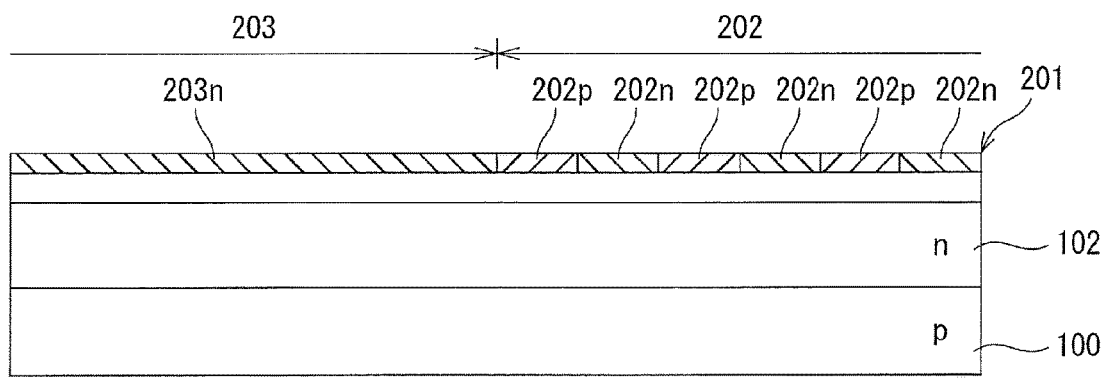
FIG. 8 is a cross-sectional view along the circumferential direction of a thin film resistive element shown in FIG. 3.

The thin film resistive element 201 is made of single-crystal silicon or polycrystalline silicon, for example. As shown in FIGS. 3, 4, and 8, the thin film resistive element 201 has therein a plurality of diodes 202 connected in series such that a first region 202n of the second conductivity type (n-type) and a second region 202p of the first conductivity type (p-type) alternate continuously along a circumferential direction from one end of the thin film resistive element. The thin film resistive element 201 also has the resistor voltage divider section 203 formed from one end of the series circuit of these diodes 202 to the other end. As shown in FIG. 2, a characteristic of one aspect of the present invention is that, among the diodes 202, a plurality of diodes having the first primary electrode wiring 301 side as the cathode are connected in series. Therefore, even if the anode of one of the diodes 202 and the cathode of the lower potential diode that connects to this diode are not connected at the pn junction, the anode and the cathode may be connected by metal wiring. The resistor voltage divider section 203 has an impurity diffusion region 203n of a first or second conductivity type, and in Embodiment 1, this region is the first conductivity type (n-type). The impurity diffusion region 203n, first region 202n, and second region 202p are formed from the top of the thin film resistive element 201 to the bottom thereof in the depth direction thereof.

When manufacturing the thin film resistive element 201, first, a CVD method is used to deposit a thin film semiconductor layer made of polycrystalline silicon, for example. Next, phosphorous (P) or arsenic (As), for example, is implanted as the impurity ion during ion implantation into the entire surface of this thin film semiconductor layer.

Boron (B), for example, is then selectively implanted as the impurity ion in this thin film semiconductor layer in the regions where the diodes will be formed, except the resistor voltage divider section 203. Thereafter, a heat treatment is applied to activate the impurities and form the n-type impurity diffusion region 203n in the resistor voltage divider section 203 and to form the plurality of diodes 202 connected in series in the areas where the diodes are formed such that the first n-type region 202n and the second p-type region 202p alternate continuously. After this, the thin film semiconductor layer can be etched using photolithography and dry etching to form the spiral-like thin film resistive element 201 having the series circuit of the plurality of diodes 202 and the resistor voltage divider section 203. The resistor voltage divider section 203 is normally lower in impurity concentration than the diodes 202; thus, the entire thin film semiconductor layer can be formed as the resistor voltage divider section 203, after which the impurity ions can be implanted into the areas where the plurality of diodes will be formed. Therefore, in the thin film semiconductor layer, it is not necessary to distinguish between the area where the resistor voltage divider section will be formed and the areas where the plurality of diodes will be formed, which makes it possible to form the plurality of diodes 202 with the resistor voltage divider section 203 with ease. The voltage applied to both ends of the resistors in the resistor voltage divider section 203 is determined by the product of the breakdown voltage of each of the diodes 202 and the number of diodes.

As shown in FIG. 7, the first resistive connection wiring 320 is electrically and metallurgically connected to the other end of the thin film resistive element 201, or namely, the outer termination, via a resistor contact section 321 that penetrates the first interlayer insulating film 210. The wiring 420 is electrically and metallurgically connected to the first resistive connection wiring 320 via a contact section 421 that penetrates the second interlayer insulating film 350.

As shown in FIG. 6, the second resistive connection wiring 330 is electrically and metallurgically connected to the resistor voltage divider section 203 between the resistor contact section 321 of the first resistive connection wiring 320 and the series circuit of the plurality of diodes 202 via a resistor contact section 331 that penetrates the first insulating film 210.

The other end (the outer termination) of the thin film resistive element 201 is electrically connected to the first resistive connection wiring 320 via the resistor contact section 321 provided in the interlayer insulating film 210. The middle of the resistor voltage divider section 203 of the thin film resistive element 201 is electrically connected to a second resistive connection wiring 330 via the resistor contact section 331 provided in the interlayer insulating film 210. One end (the inner termination) of the thin film resistive element 201 is electrically connected to the first primary electrode wiring 301 via the first primary electrode contact section 310 provided in the interlayer insulating film 210.

The first resistive connection wiring 320 is always grounded. The second resistive connection wiring 330 is connected to the BO terminal 62. Accordingly, with respect to the thin film resistive element 201, the area from the termination of the series circuit of the plurality of diodes 202 to the resistor contact section 331 of the second resistive connection wiring 330 corresponds to the resistor 73 on the side that connects to the VH terminal 61, and the area from the resistor contact section 331 of the second resistive connection wiring 330 to the resistor contact section 321 of the first resistive connection wiring 320 corresponds to the resistor 74 on the side that is grounded. In other words, the first resistor 73 and the second resistor 74, which form the voltage divider 65c, are formed in the resistor voltage divider section 203.

In Embodiment 1, the resistor 73 and the resistor 74 are arranged on the start-up device 65a, but it is possible for only the resistor 73 to be formed on the start-up device 65a, and for the resistor 74 to be formed on an area other than on the start-up device 65a. When a voltage of 500V is applied to the VH terminal 61, it is necessary for the resistor 73 to have a breakdown voltage of 500V due to being directly connected with the VH terminal 61, but only approximately 5V is applied to the resistor 74. Accordingly, the resistor 74 can be formed on an interlayer insulating film of approximately several hundred Å on the semiconductor substrate, and can be formed by an ordinary process for forming a thin film resistor.

In the start-up device 65 having the configuration described above, a structure for increasing breakdown voltage is realized by the junction of the base region 103 and the drift region 102, and a structure for large current is realized by the second primary electrode region (source region) 104; thus, it is possible to combine both a higher breakdown voltage and a lower ON resistance. When voltage is applied to the first primary electrode region (drain region) 101, the drain current flows in a radial manner. If the second primary electrode region 104 is biased to have a positive potential, and this potential increases to a certain level, then the drift region 102 is cut off by the depletion layer, and the drain current is blocked. In Embodiment 1, the drain-source area is designed to have a breakdown voltage of at least 500V, for example, mainly due to the junction of the base region (gate region) 103 and the drift region 102.

Figure 9:
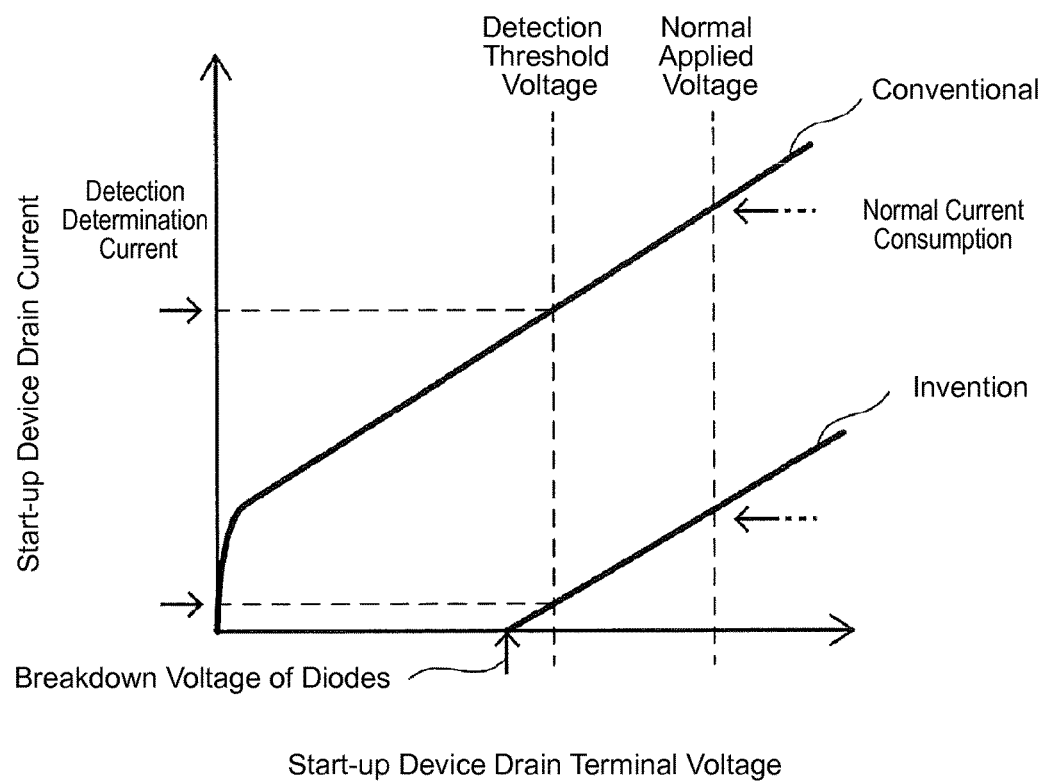
FIG. 9 is a comparison of characteristics between a conventional semiconductor device and the semiconductor device of Embodiment 1 of the present invention.

FIG. 9 is a comparison of characteristics between the semiconductor device 31 according to Embodiment 1 of the present invention and a conventional semiconductor device. In the semiconductor device 31 of Embodiment 1, examples of characteristics of the start-up device are shown when the thin film resistive element 201 is formed by the plurality of diodes 202 and the resistor voltage divider section 203 in a polysilicon layer. For the conventional semiconductor device, an example of characteristics is shown for a resistor voltage divider integrated with a start-up device.

As is clear from FIG. 9, the semiconductor device 31 of Embodiment 1 has a lower current consumption than the conventional semiconductor device. This is because the voltage at the rise of the current can be made higher in accordance with the breakdown voltage to a greater degree than the conventional semiconductor device. This allows ordinary current consumption to be reduced. As a result, the semiconductor device 31 according to Embodiment 1 of the present invention makes it possible to reduce power consumption. It should be noted that it is preferable for the breakdown voltage of the plurality of diodes 202 and the detected threshold voltage to be configured such that the breakdown voltage of the plurality of diodes 202 are lower than the detected threshold voltage.

Furthermore, in the semiconductor device 31 of the Embodiment 1, even if the area of the start-up device 65a is increased and the number of coils of the thin film resistive element 201 remains the same, the voltage applied to both ends of the thin film resistor 201 drops, which allows for the device to be made more compact while lowering power consumption.

Moreover, in the semiconductor device 31 according to Embodiment 1 of the present invention, even if the impurity dosage is diluted and the sheet resistance itself of the thin film resistive element is not increased, the voltage applied to both ends of the thin film resistive element 201 becomes less; thus, it is possible to suppress variation in resistance while lowering power consumption.

Embodiment 2

In a semiconductor device 31A according to Embodiment 2 of the present invention, two high breakdown voltage field effect transistors forming a start-up device 65 are constituted by an n-channel conductive insulated gate transistor (n-type MOSFET) instead of the junction transistors (the JFETs 81 and 82 in Embodiment 1). The differences between the semiconductor device of Embodiment 2 and the semiconductor device of Embodiment 1 will be explained below with reference to FIG. 10.

Figure 10:
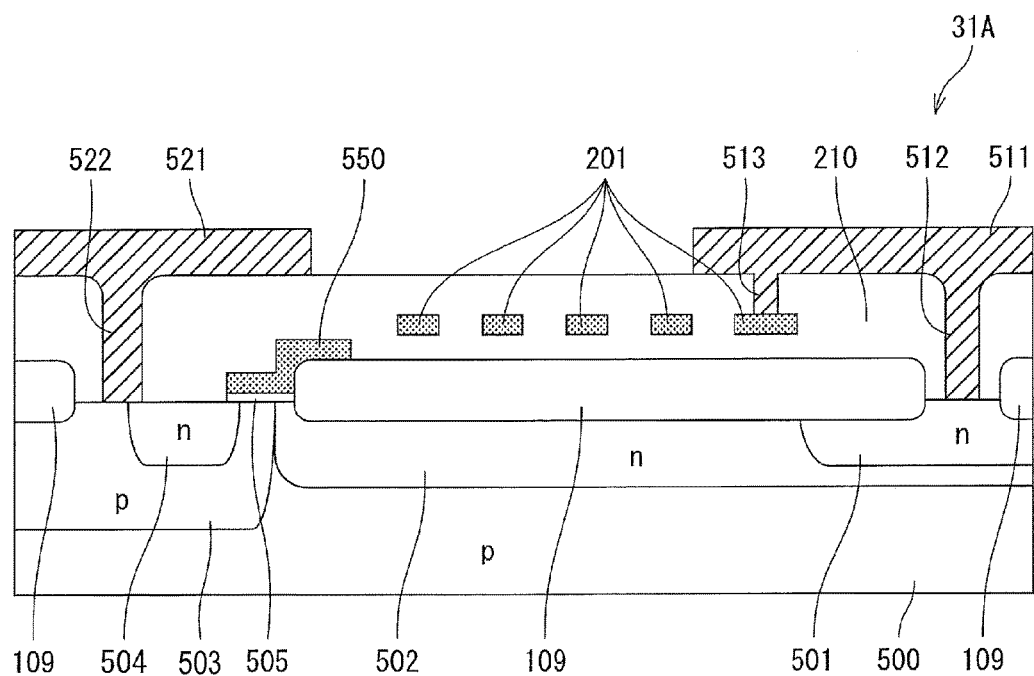
FIG. 10 is a cross-sectional view that shows a schematic configuration of primary components of a semiconductor device according to Embodiment 2 of the present invention.

As shown in FIG. 10, the n-type MOSFET-Qn is formed in the surface of a semiconductor substrate 500 of the first conductivity type (p-type).

The n-type MOSFET-Qn has a first primary electrode region (drain region) 501 of a second conductivity type (n-type), a drift region 502 of a second conductivity type (n-type), a base region (area where the channel will be formed) 503 of the first conductivity type (p-type), a second primary electrode region (source region) 504 of the second conductivity type (n-type), a gate insulating film 505, and a gate electrode 550.

The drift region 502 is formed in the primary surface of the semiconductor substrate 500. The first primary electrode region 501 is formed in the primary surface of the semiconductor substrate 100 inside the drift region 502. The base region 503 is selectively formed in the primary surface of the semiconductor substrate 100 outside the drift region 502 so as to contact the drift region 502. The second primary electrode region 504 is formed in the primary surface of the semiconductor substrate 100 inside the base region 503 and separated from the drift region 502. The gate insulating film 505 is formed on the primary surface of the semiconductor substrate 501 across the drift region 502 and the base region 503. The gate electrode 550 is formed from a field insulating film 109 to the gate insulating film 505.

First primary electrode region wiring 511 is electrically and metallurgically connected to one end of the first primary electrode region 501 and thin film resistive element 201 via a first primary electrode contact section 512 and a resistor contact section 513 that penetrate a first interlayer insulating film 210.

Second primary electrode region wiring 521 is electrically and metallurgically connected to the second primary electrode region 504 and the base region 503 via a second primary electrode contact section 522 that penetrates the first interlayer insulating film 210.

The thin film resistive element 201 is arranged on the voltage-withstanding region (drift region 502) of the n-type MOSFET-Qn through the field insulating film 109. The thin film resistive element 201 has a similar configuration to Embodiment 1 described above.

The semiconductor device 31A of Embodiment 2 configured in this manner can obtain similar effects to the semiconductor device of Embodiment 1.

Embodiment 3

A semiconductor device 30B according to Embodiment 3 of the present invention will be described below with reference to FIGS. 11 and 12. It is possible to use a JFET 610 having a different configuration instead of the JFETs 81 and 82 described above. In the JFETs 610 and 611, the depletion layer that spreads from a base region (gate region) 705 and a semiconductor substrate 701 of a first conductivity type (p-type) extends vertically and pinches off the device.

Figure 11:
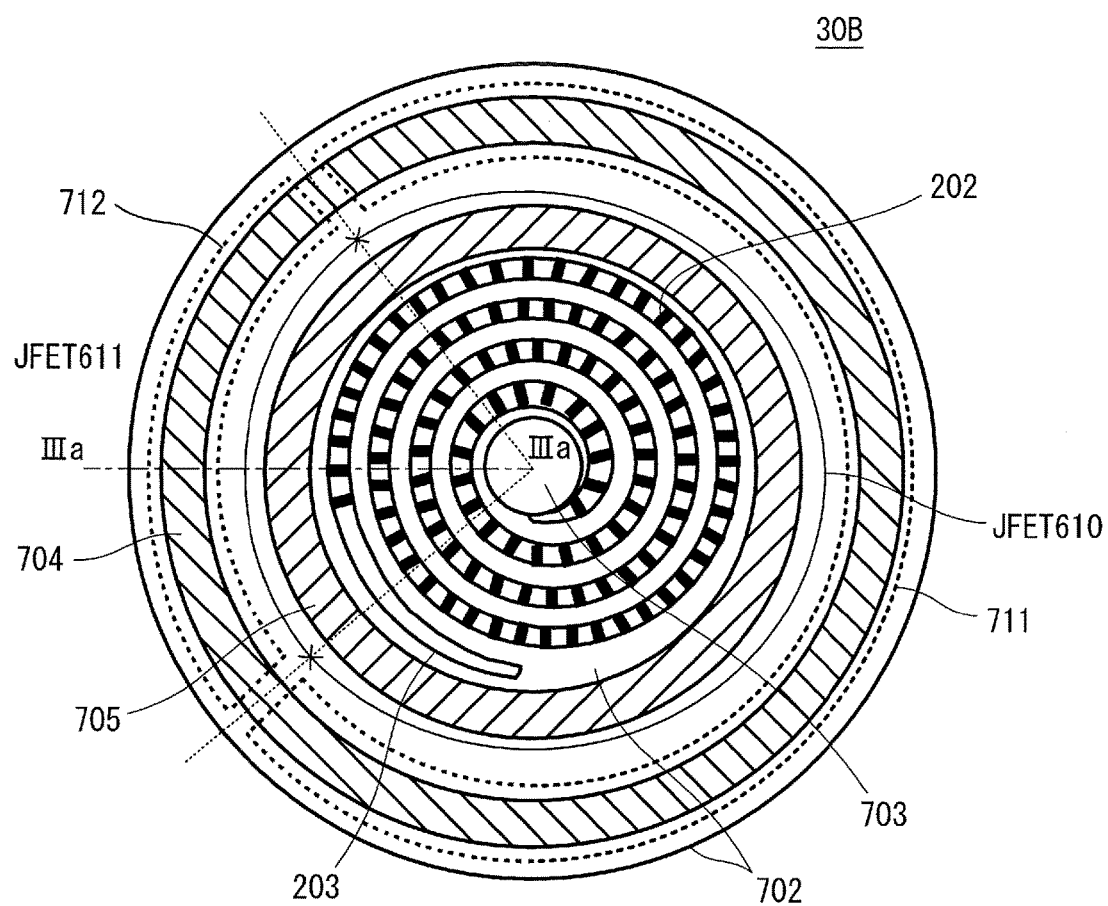
FIG. 11 is a plan view that shows a schematic configuration of primary components of a semiconductor device according to Embodiment 3 of the present invention.
Figure 12:
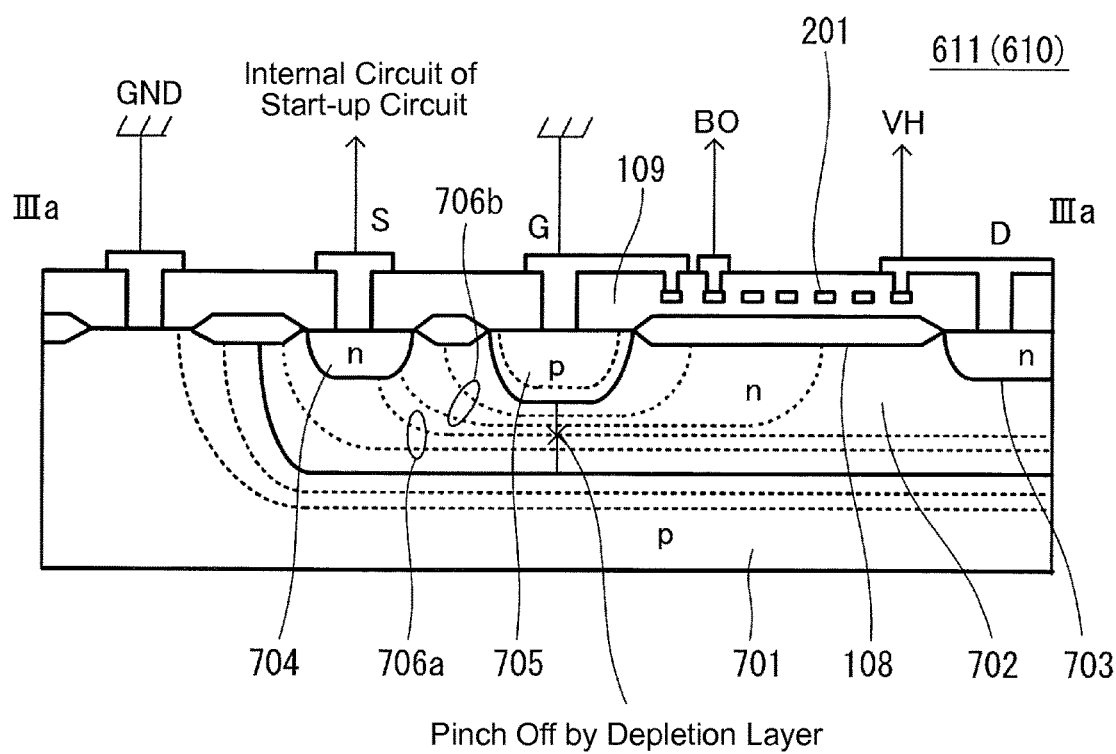
FIG. 12 is a cross-sectional view along the line IIIa-IIIa in FIG. 11.

In FIG. 11, among the electrodes, only the source electrode has been shown for convenience with a dotted line. In FIG. 11, first second primary electrode wiring (source electrode wiring) 711 and a second primary electrode wiring (source electrode wiring) 712 are formed, and the first source electrode wiring 711 side is the JFET 610, which corresponds to the JFET 81 in FIG. 2, and the second source electrode wiring 712 side is the JFET 611, which corresponds to the JFET 82 in FIG. 2. As shown in FIG. 12, these JFETs 610 and 611 include: an n-well region that serves as the drift region 702 of the second conductivity type (n-type) arranged in the surface layer of the semiconductor substrate 701; an n-region that serves as the first primary electrode region (drain region) 703 of the second conductivity type (n-type) arranged in the surface layer of the n-well region; an n-region that serves as the source region 704 of the second conductivity type (n-type) arranged around the drain region 703 and separated from the drift region 702; and a p-region that serves as the base region 705 of the first conductivity type (p-type) arranged between the drain region 703 and the source region 704. The base region 705 is also arranged separated from the drain region 703. Furthermore, a field insulating film 108 is provided on the drift region 702, and the thin film resistive element 201 is arranged in an interlayer insulating film 210 on the field insulating film 108. The drain region 703 and the source region 704 are formed separated from the pn junction of the semiconductor substrate 701 and the drift region 702, but these regions may be in contact with each other. Moreover, the source region 704 is formed as a single annular region in a plan view, but may be divided into a plurality of regions in a circumferential direction.

In these JFETs 610 and 611, a depletion layer 706a that spreads from the semiconductor substrate 701 to the drift region 702 pinches off (connects to) a depletion layer 706b spreading from the base region 705 to the drift region 702 towards the semiconductor substrate 701, thereby controlling current. The circuit configuration is the same as Embodiment 1. In the drawing, the reference character "S" indicates S, "G" indicates gate, and "D" indicates drain.

In this manner, the semiconductor device 30B according to Embodiment 3 of the present invention includes the thin film resistive element 201; therefore, the semiconductor device 30B according to Embodiment 3 of the present invention can exhibit effects similar to those of the semiconductor device 31 of Embodiment 1.

The invention made by the present inventor was described in detail in the embodiments above, but the present invention is not limited to these embodiments, and various modifications can be made without departing from the scope thereof.

In the respective embodiments above, the thin film resistive element 201 was described as the diodes 202 and the resistor voltage divider section 203 formed on a transistor, but the diodes 202 may be arranged on the transistor while the resistor voltage divider section 203 is provided on a semiconductor substrate other than the transistor, for example. In this case, the resistors of the resistor voltage divider section 203 may be formed by polycrystalline silicon via the insulating film on the semiconductor substrate. Alternatively, this resistor may be formed by a diffusion layer formed in the surface layer of the semiconductor substrate.

The present invention can also be applied to semiconductor devices having IGBTs, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate of a first conductivity type having a first region of a second conductivity type formed in a surface thereof;
   an insulating film on the semiconductor substrate;
   a primary wiring line connected to the first region and configured to receive a voltage from outside;
   a plurality of diodes connected in series on the insulating film, said series of diodes having a spiral shape generally centering around the first region in a plan view, said plurality of diodes having one end of the series thereof connected to the primary wiring line and serving as a cathode;
   a resistor voltage divider including at least two resistors connected in series, the resistor voltage divider having one end connected to another end of the series of the diodes such that the plurality of diodes and the resistor voltage divider are connected in series;
   a first connection wiring line connected to another end of the resistor voltage divider; and
   a second connection wiring line connected to a midpoint between said another end of the series of diodes and said another end of the resistor voltage divider.

2. A semiconductor device, comprising:
   a semiconductor substrate of a first conductivity type having a first region of a second conductivity type formed in a surface thereof;
   an insulating film provided on the semiconductor substrate;
   a primary wiring line connected to the first region and configured to receive a voltage from outside;
   a thin film semiconductor pattern on the insulating film, the thin film semiconductor pattern having a spiral shape generally centering around the first region in a plan view, one end of the thin film semiconductor pattern being connected to the primary wiring line; and
   a first connection wiring line connected to another end of the thin film semiconductor pattern;
   wherein the thin film semiconductor pattern comprises:
      a plurality of diodes connected in series from said one end of the thin film semiconductor pattern, each diode having a region of the first conductivity type and a region of the second conductivity type continuously and alternately arranged along the spiral shape; and
      a resistor voltage divider formed from an end of the series of the plurality of diodes to said another end of the thin film semiconductor pattern, and
   wherein the semiconductor device further includes a second connection wiring line connected to a midpoint between said another end of the series of diodes and said another end of the thin film semiconductor pattern.

3. The semiconductor device according to claim 2, wherein the resistor voltage divider includes a region of the first conductivity type or second conductivity type.

4. The semiconductor device according to claim 3, wherein the resistor voltage divider includes a first resistor element and a second resistor element connected thereto.

5. The semiconductor device according to claim 2, further comprising:
   a drift region of the second conductivity type formed in the surface of the semiconductor substrate in contact with the first region; and
   a second region of the second conductivity type formed in the surface of the semiconductor substrate around and in contact with the drift region,
   wherein the thin film semiconductor pattern is disposed on the drift region and the first region.

6. The semiconductor device according to claim 1, further comprising:
   a comparator; and
   a reference power supply,
   wherein a non-inverting input terminal of the comparator is connected to the second connection wiring line, and
   wherein an inverting input terminal of the comparator is connected to a high potential side of the reference power supply.

7. The semiconductor device according to claim 6, wherein a breakdown voltage of the plurality of diodes connected in series and having said one end thereof serving as the cathode is less than a voltage of the high potential side of the reference power supply.

8. The semiconductor device according to claim 2, further comprising:
   a comparator; and
   a reference power supply,
   wherein a non-inverting input terminal of the comparator is connected to the second connection wiring line, and
   wherein an inverting input terminal of the comparator is connected to a high potential side of the reference power supply.

9. The semiconductor device according to claim 8, wherein a breakdown voltage of the plurality of diodes connected in series and having said one end thereof serving as the cathode is less than a voltage of the high potential side of the reference power supply.

* * * * *

UNITED STATES PATENT AND TRADEMARK OFFICE
CERTIFICATE OF CORRECTION

PATENT NO.        : 9,667,242 B2
APPLICATION NO.   : 14/844986
DATED             : May 30, 2017
INVENTOR(S)       : Masaru Saito Page 1 of 1

It is certified that error appears in the above-identified patent and that said Letters Patent is hereby corrected as shown below:

In the Specification

Column 12, Line 15, the text "A" should be changed to -- Å --.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*